United States Patent [19]
Tsai et al.

[11] Patent Number: 5,712,185
[45] Date of Patent: Jan. 27, 1998

[54] METHOD FOR FORMING SHALLOW TRENCH ISOLATION

[75] Inventors: Meng-Jin Tsai, Pao-Shan Hsiang; Water Lur, Taipei; Chin-Lai Chen, Tao-Yuan Hsien, all of Taiwan

[73] Assignee: United Microelectronics, Hsinchu, Taiwan

[21] Appl. No.: 636,623

[22] Filed: Apr. 23, 1996

[51] Int. Cl.$^6$ .................................................. H01L 21/76
[52] U.S. Cl. .................................... 437/67; 156/636.1
[58] Field of Search ........................... 437/67, 228 TR; 148/DIG. 50, DIG. 85, DIG. 86

[56] References Cited

U.S. PATENT DOCUMENTS

| | | | |
|---|---|---|---|
| 4,663,832 | 5/1987 | Jambotkar | 437/67 |
| 5,578,518 | 11/1996 | Koike et al. | 437/67 |

FOREIGN PATENT DOCUMENTS

| | | |
|---|---|---|
| 61-137338 | 6/1986 | Japan . |
| 63-305527 | 12/1988 | Japan . |
| 4-303942 | 10/1992 | Japan . |

*Primary Examiner*—George R. Fourson
*Attorney, Agent, or Firm*—Harness, Dickey & Pierce, P.L.C.

[57] ABSTRACT

A method for forming shallow trench isolation without a recessed edge problem is disclosed. The present invention comprises forming a pad oxide layer on a substrate. Next, a silicon nitride layer is formed on the pad oxide, and a sacrificial layer is formed on the silicon nitride layer. A photo-resist layer that defines an active region on the sacrificial layer is applied. Thereafter, the portions of the sacrificial layer, the silicon nitride layer, the pad oxide layer and the substrate are removed to form a trench. Portions of the silicon nitride layer are undercut, and a dielectric layer is formed to fill the trench. The dielectric layer is planarized until the silicon nitride layer is exposed. Finally, the silicon nitride layer and the pad oxide layer are removed.

12 Claims, 7 Drawing Sheets

METHOD FOR FORMING SHALLOW TRENCH ISOLATION

BACKGROUND OF THE INVENTION

1. Field of the Invention

The present invention relates to a method for forming isolation regions among devices on a semiconductor substrate, and more particularly to a method for forming a shallow trench isolation structure.

2. Description of the Prior Art

The art of isolating devices that are built on a semiconductor substrate becomes one important aspect of modern metal-oxide-semiconductor (MOS) and bipolar integrated circuit technology as many as hundreds of thousands of devices are used in a single chip. Improper isolation among transistors will cause current leakages, which can consume significant power for the entire chip. In addition, improper isolation can further escalate latchup to damage the circuit function momentarily or permanently. Still further, improper isolation can result in noise margin degradation, voltage shift or crosstalk.

In MOS technology, isolation is usually practiced by forming the isolation regions between neighboring active regions. Typically, an isolation region is formed by ion-doping a channel stop of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not occur under the field oxide region.

The conventional LOCOS (LOCal Oxidation of Silicon) process is used to develop regions which laterally isolate the active devices on the integrated circuits. The LOCOS structure is typically formed by using a patterned silicon nitride layer together with a pad oxide, which is utilized to release stress caused by the silicon nitride layer, underneath to mask the active regions, followed by ion-implantation in the isolation region and then growing a thick field oxide locally.

The structure mentioned above possesses some inherent drawbacks resulting from the processes, i.e., lateral oxidation of the silicon underneath the silicon nitride mask, making the edge of the field oxide resemble the shape of a bird's beak, and the lateral diffusion of channel-stop dopants, making the dopants encroach into the active device regions. Both effects overtake the active device regions, making the physical channel width less than the desired channel width. The reduced portion overtaken by both effects will make the situation even worse when devices are scaled down for very large scale integration (VLSI) implementation, increasing threshold voltage and reducing the current driving capability.

According to the disadvantage mentioned above for the LOCOS isolation structure, an isolation technique by using shallow trench is developed. FIG. 1A to FIG. 1G illustrate a method to fabricate a shallow trench isolation region in the prior art. Referring to FIG. 1A, a pad oxide layer 12 is deposited on a substrate 10, and a silicon nitride layer 14 is further deposited on the pad oxide layer 12. By applying a photo-resist 16 (FIG. 1B) as a mask, a trench 18 is formed, the photo-resist 16 is removed, and an optional side wall 13 oxidation is performed, resulting in the structure as shown in FIG. 1C. Next, referring to FIG. 1D, a tetraethoxysilane (TEOS) oxide layer 20 is deposited into the trench 18 and is then subjected to a planarization process (FIG. 1E). After the silicon nitride layer 14A is removed (FIG. 1F) and the pad oxide layer 12A is removed (FIG. 1G), the isolation region 20C thus formed possesses recessed edges 22 as shown in FIG. 1G.

The recessed edges 22 will result in the subthreshold kink effect which can lower the threshold voltage of the device and further escalate a leakage problem. FIG. 2A shows an ideal transfer curve of a device, where $I_D$, $V_G$ and $V_D$ representing drain electrode current, gate electrode voltage and drain voltage respectively. FIG. 2B shows the response curve of a device fabricated by a conventional shallow trench isolation technique in connection with FIGS. 1A–1G. The curve in FIG. 2B possesses a subthreshold region 26 which will cause a lower threshold voltage and more leakage.

SUMMARY OF THE INVENTION

It is an object of the present invention to eliminate the recessed trench edges problem of the prior art method for forming shallow trench isolation in a semiconductor substrate.

It is another object of the present invention to avoid subthreshold kink effect of the prior art method, thereby forming shallow trench isolation without threshold kink and leakage problems.

The present invention comprises forming a pad oxide layer on a substrate, forming a silicon nitride layer on the pad oxide, forming a sacrificial layer on the silicon nitride layer, forming a photo-resist layer that defines an active region on the sacrificial layer, removing the portions of the sacrificial layer, the silicon nitride layer, the pad oxide layer and the substrate to form a trench, undercutting portions of the silicon nitride layer, forming a dielectric layer to fill the trench, planarizing the dielectric layer until the silicon nitride layer is exposed, removing the silicon nitride layer, and removing the pad oxide layer.

DESCRIPTION OF THE PREFERRED EMBODIMENT

Figure 1A:
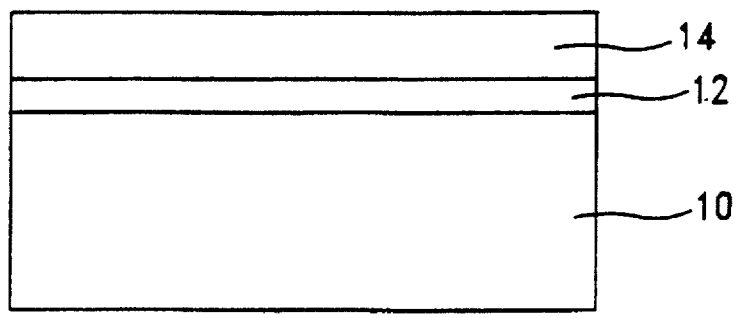
FIGS. 1A–1G illustrate schematically cross-sectional views of a method in the prior art for forming a shallow trench isolation region.
Figure 1B:
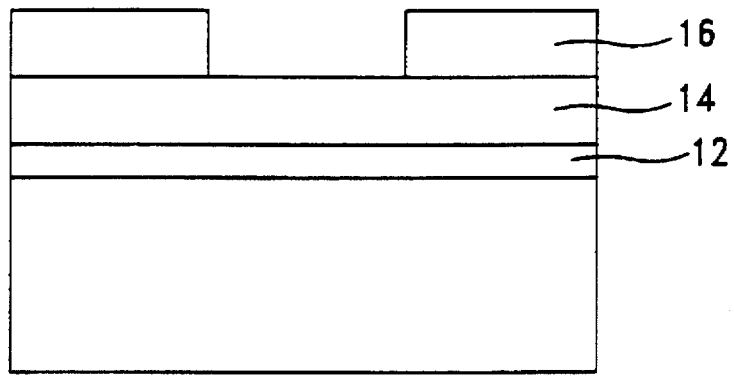
Figure 1C:
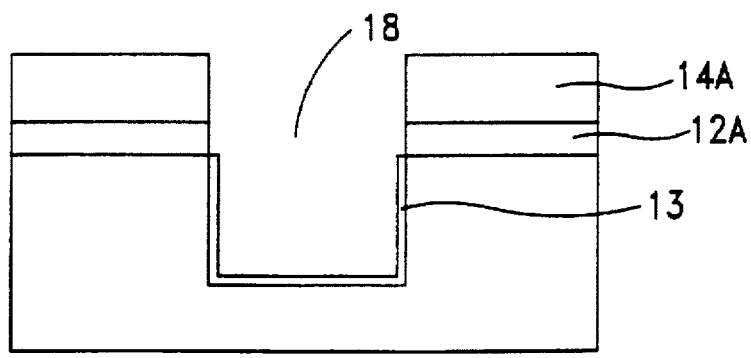
Figure 1D:
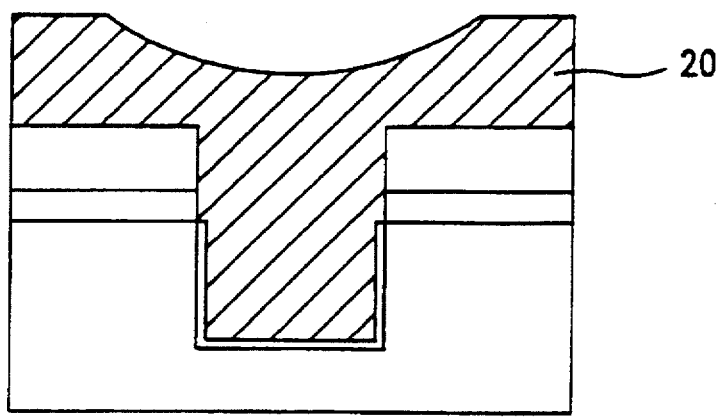
Figure 1E:
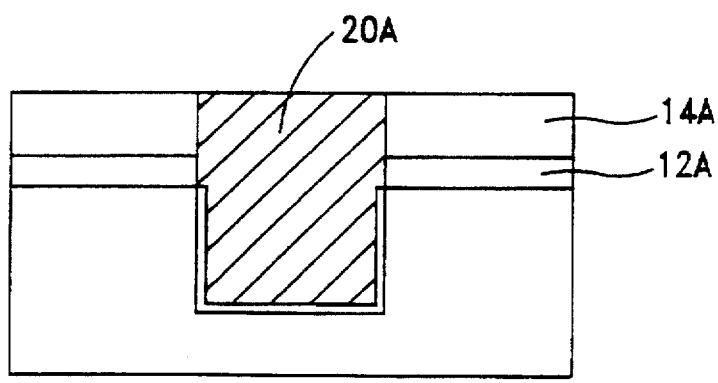
Figure 1F:
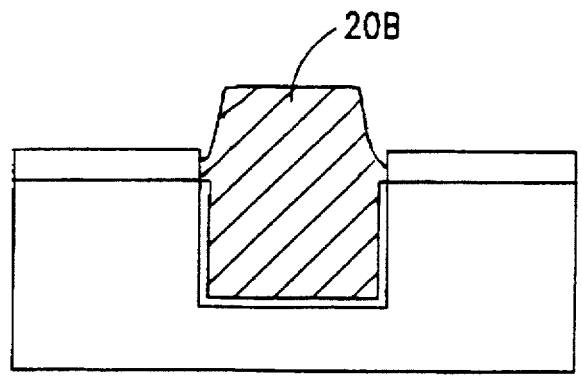
Figure 1G:
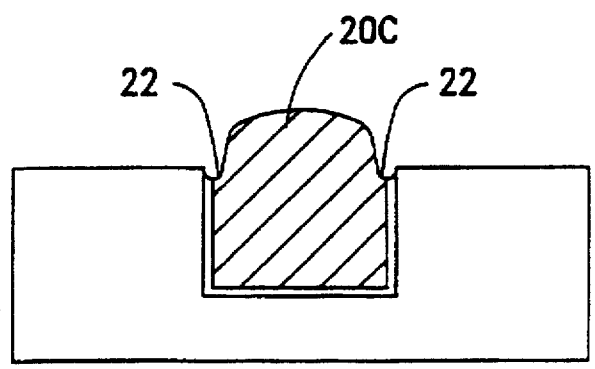
Figure 2A:
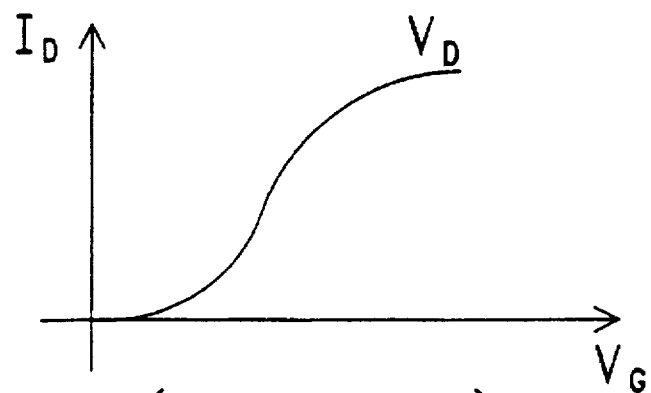
FIG. 2A shows an ideal response curve of a device.
Figure 2B:
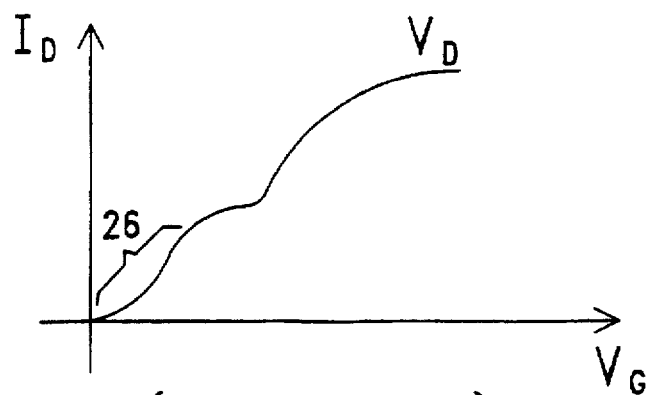
FIG. 2B shows the response curve of a device fabricated by a conventional shallow trench isolation technique.
Figure 3A:
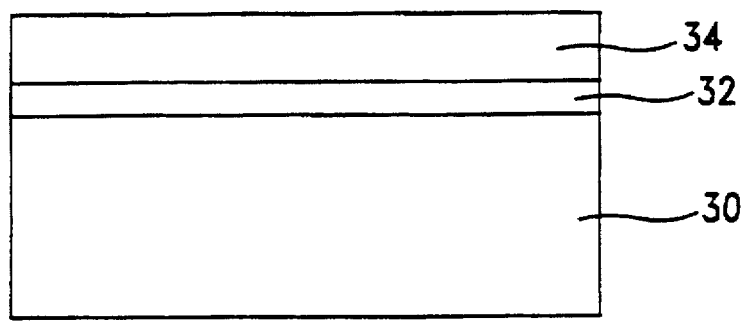
FIGS. 3A–3J illustrate schematically cross-sectional views of the present invention for forming a shallow trench isolation region in a semiconductor substrate.

FIG. 3A shows a schematic cross-section of a semiconductor substrate 30, having thereon a pad oxide layer 32 with a thickness of about 50–300 Å. This pad oxide layer 32 releases stress caused by a silicon nitride layer 34, which has a thickness of about 1000–5000 Å and is deposited on the pad oxide layer 32.

A polysilicon layer 36 (FIG. 3B) is deposited on the silicon nitride layer 34 by low pressure chemical vapor deposition (LPCVD) or plasma enhanced CVD (PECVD), having a thickness of about 500–2000 Å. This polysilicon layer 36 serves as a sacrificial layer and can be replaced by, for example, a silicon oxide layer 36, which can be deposited on the silicon nitride layer 34 by many conventional methods such as atmospheric pressure CVD (APCVD), LPCDV, PECVD or by implanting oxygen onto the surface of the silicon nitride layer 34 so as to form the silicon oxide layer 36 in the upper portion of the silicon nitride layer 34.

Figure 3B:
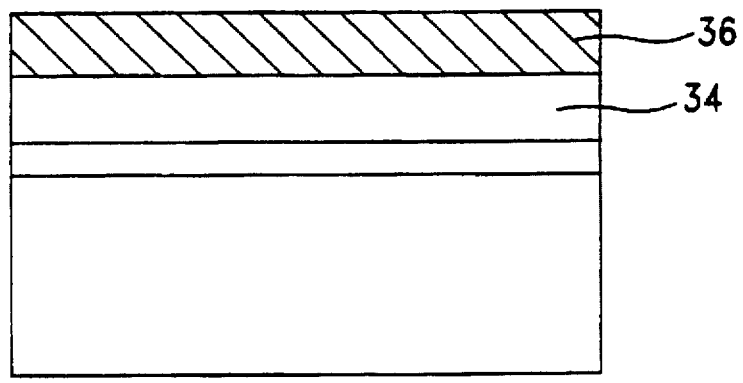
Figure 3C:
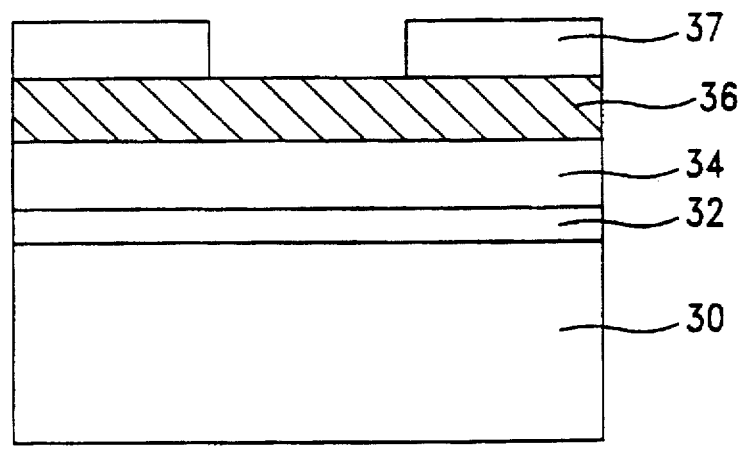
Figure 3D:
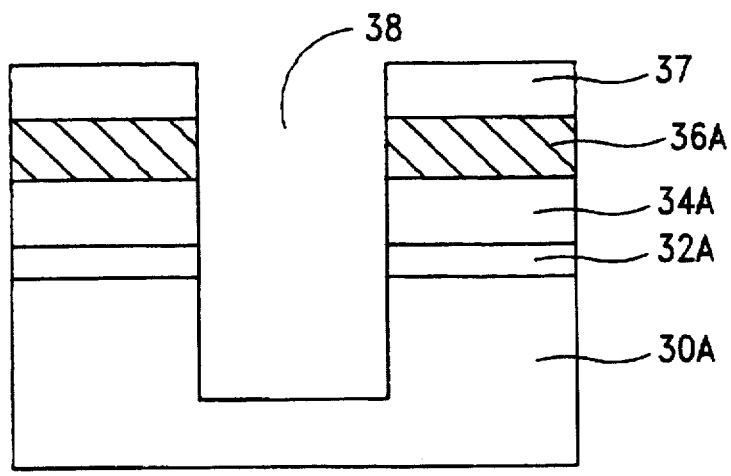

Referring to FIG. 3C, a photo-resist mask 37 which defines active regions is formed on the sacrificial layer 36. Using the photo-resist 37 as an etching mask, a shallow trench 38 is formed by etching portions of the sacrificial layer 36, the silicon nitride layer 34, pad oxide 32 and the substrate 30, resulting in the structure as shown in FIG. 3D. After the trench 38 is formed, the photo-resist 37 is stripped.

Another way to forming a trench 38 is firstly etching portions of the sacrificial layer 36, the silicon nitride layer 34 and the pad oxide 32 using the photo-resist 37 as a mask. Thereafter, the photo-resist 37 is stripped and then a portion of the substrate 30 is etched using the sacrificial layer 36A as a mask, resulting in the same structure of FIG. 3D. The advantage of using a two-step etch instead of a one-step etch is the lack of residual polymer resulting from the processing of the photo-resist 37.

Figure 3E:
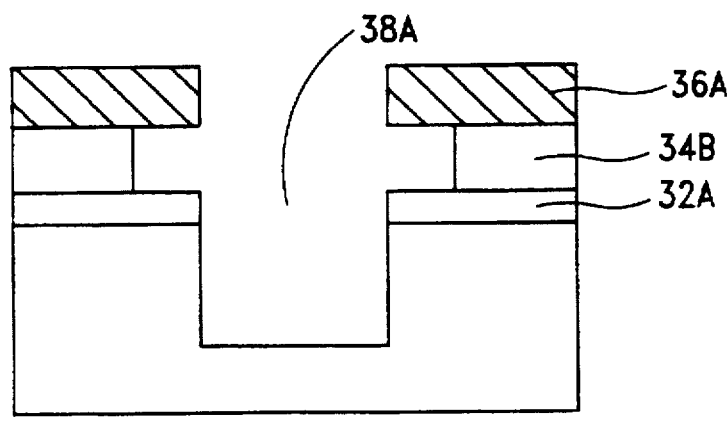
Figure 3F:
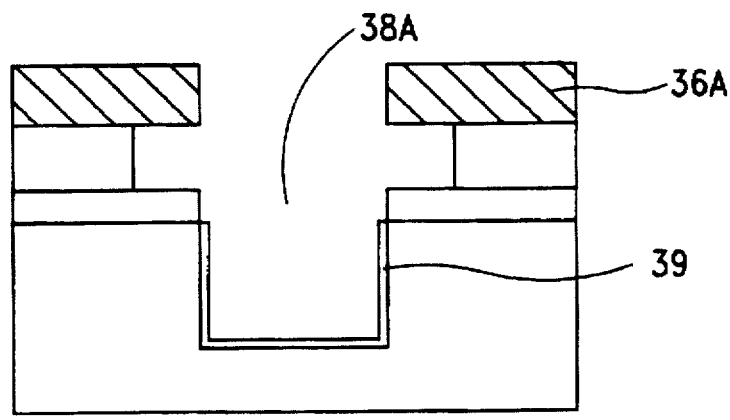
Figure 3G:
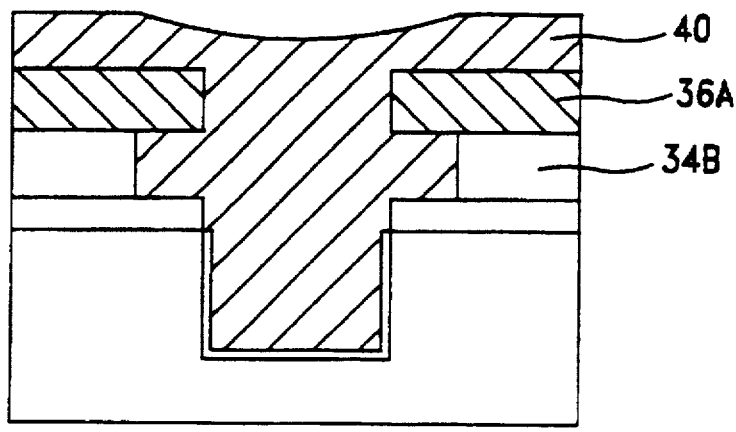

Portions of the silicon nitride layer 34A are undercut or descumed, and the lateral dimension thereof is about 50–1000 Å. The descum process is typically performed in a phosphoric acid solution at about 80°–180° C. or performed by a dry etching method such as plasma etching. Due to the photo-resist adhesion problems encountered when etching with hot phosphoric acid, it is the reason that we form the sacrificial layer with a high silicon nitride/sacrificial selectivity on top of the silicon nitride layer before applying the photo-resist layer 37 (FIG. 3B). The photo-resist pattern is then transferred to the sacrificial layer 36, which then serves as a mask for the underlying silicon nitride layer 34A, resulting in the structure as shown in FIG. 3E. Because of the high selectivity of silicon nitride/silicon oxide or silicon nitride/polysilicon, the descum etchant attach the sacrificial layer 36A very slowly. After the descum process, the sacrificial layer 36A can be optionally removed. Thereafter, as shown in FIG. 3F, a side wall 39 oxidation is usually performed for relieving the defect resulting from the aforementioned etching process. The thickness of this sidewall is about 100–500 Å. The resultant structure is then subject to a refilling step to fill the trench 38A with a dielectric layer 40 (FIG. 3G).

The forming of this dielectric layer 40 is typically done by decomposing tetraethoxysilane (TEOS) at about 650°–750° C. to form a silicon oxide layer 40. This silicon oxide layer 40 can also be formed by reacting TEOS with oxygen at low pressure and high temperature at about 650°–750° C., wherein the net reaction is:

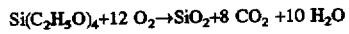

$Si(C_2H_5O)_4 + 12\ O_2 \rightarrow SiO_2 + 8\ CO_2 + 10\ H_2O$

The TEOS silicon oxide layer 40 described above possesses good uniformity and step coverage.

Figure 3H:
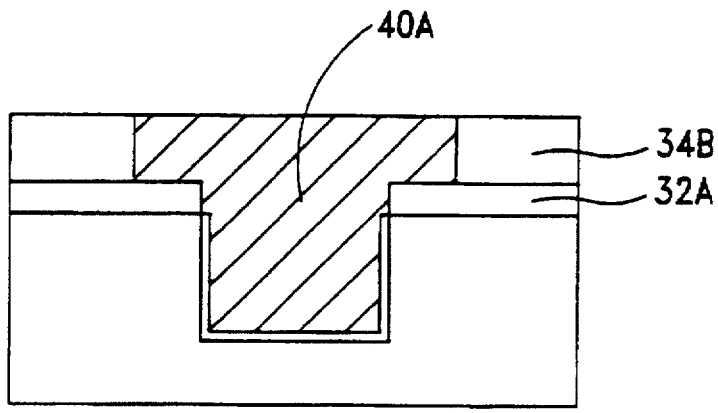

The dielectric layer 40 is then planarized (FIG. 3H) until the sacrificial layer 36 is exposed. The planarization step is done, for example, by chemical-mechanical polishing (CMP) or by etching back method. It is worth noticing that the silicon nitride layer 34B acts as an end point detecting layer during the CMP process.

Figure 3I:
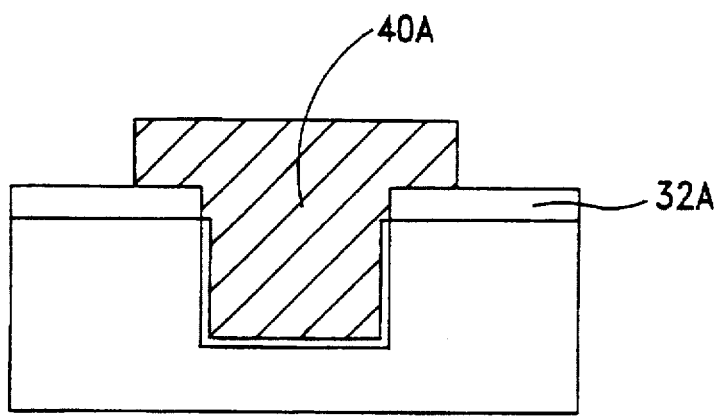
Figure 3J:
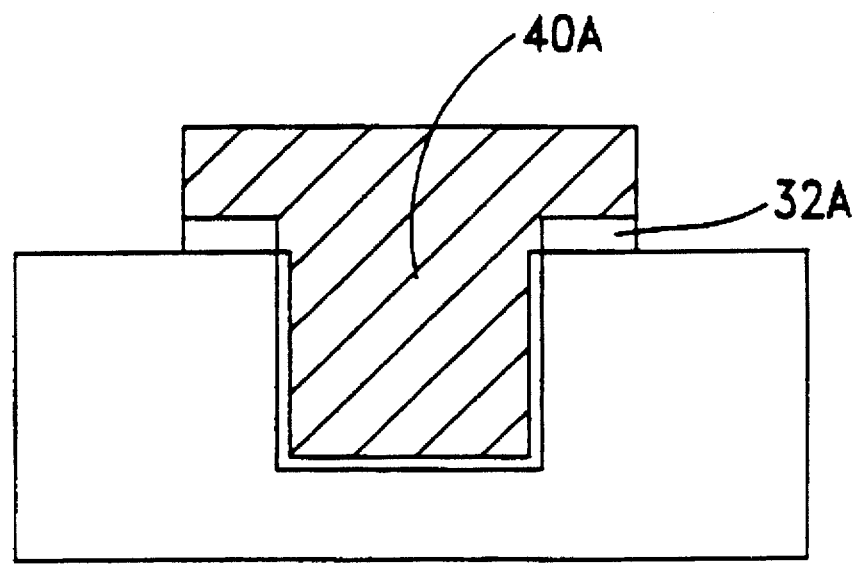

FIG. 3I shows the cross-sectional view of the isolation region 40A after removing the silicon nitride layer 34B by, for example, etching in a boiling phosphoric acid solution at about 180° C. FIG. 3J shows the cross-sectional view of the isolation region 40A after removing the pad oxide layer 32A by, for example, etching in a dilute solution of hydrofluoric acid, buffered with ammonium fluoride. As a result, the isolation region 40B thus formed is flee of recess trench edges as described in the background of the invention hereinabove.

The specific embodiment described above is illustrative of the principles of the invention and is not intended to limit the invention to the embodiment described. Accordingly, although a specific embodiment has been illustrated and described, it will be obvious to those skilled in the art that various modification may be made without departing from the spirit and the scope of the invention, which is intended to be limited solely by the appended claims.

What is claimed is:

1. A method for forming a trench isolation, the method comprising:

forming a pad oxide layer on a semiconductor substrate;

forming a silicon nitride layer on the pad oxide layer;

forming a sacrificial layer on the silicon nitride layer;

forming a photo-resist layer that defines an active region on the sacrificial layer;

removing the portions of the sacrificial layer, the silicon nitride layer, the pad oxide layer and the semiconductor substrate to form a trench;

undercutting portions of the silicon nitride layer;

forming a dielectric layer over the sacrificial layer, thereby completely filling the trench in the semiconductor substrate, the pad oxide layer, the silicon nitride layer, the sacrificial layer, and completely filling the undercut of the silicon nitride layer;

planarizing the dielectric layer and the sacrificial layer until the silicon nitride layer is exposed;

removing the silicon nitride layer; and removing portions of the pad oxide layer using the remaining dielectric layer as a mask.

2. The method according to claim 1, wherein said sacrificial layer is a polysilicon layer.

3. The method according to claim 1, wherein said sacrificial layer is a silicon oxide layer.

4. The method according to claim 2, wherein said polysilicon layer is deposited by low pressure chemical vapor deposition.

5. The method according to claim 3, wherein said silicon oxide layer is deposited by one of following methods: atmospheric pressure chemical vapor deposition, low pressure chemical vapor deposition, and plasma enhanced chemical vapor deposition.

6. The method according to claim 3, wherein said silicon oxide layer is deposited by implanting oxygen onto the surface of the silicon nitride layer, thereby forming the silicon oxide layer on the silicon nitride layer.

7. The method according to claim 1, wherein said portions of the silicon nitride layer are undercut by etching in a phosphoric acid solution at 80°–180° C.

8. The method according to claim 1, wherein said portions of the silicon nitride layer are undercut by plasma etching.

9. The method according to claim 1, wherein said dielectric layer comprises silicon oxide.

10. The method according to claim 1, wherein said planarization is performed by chemical-mechanical polishing.

11. The method according to claim 1, wherein said planarization is performed by etching back method.

12. The method according to claim 1, wherein said step for forming a trench comprises the steps of:

removing the portions of the sacrificial layer, the silicon nitride layer and the pad oxide layer using the photo-resist as a mask;

removing the photo-resist; and removing the portion of the semiconductor substrate using the sacrificial layer as an etch mask.

* * * * *

UNITED STATES PATENT AND TRADEMARK OFFICE
CERTIFICATE OF CORRECTION

PATENT NO. : 5,712,185
DATED : January 27, 1998
INVENTOR(S) : Tsai et al.

It is certified that error appears in the above-identified patent and that said Letters Patent is hereby corrected as shown below:

Column 1, line 13, claim 15, "modem" should be --modern--;
Column 2, line 9, claim 5, "representing" should be --represent--;

Column 3, line 32, claim 13, "attach" should be --attacks--;
Column 3, line 63, claim 13, "flee" should be --free--;
Column 4, line 4, claim 15, "modification" should be --modifications--.

Signed and Sealed this

Eighth Day of September, 1998

Attest:

BRUCE LEHMAN

Attesting Officer

Commissioner of Patents and Trademarks